(12) United States Patent
Yang et al.

(10) Patent No.: US 6,171,929 B1
(45) Date of Patent: Jan. 9, 2001

(54) SHALLOW TRENCH ISOLATOR VIA NON-CRITICAL CHEMICAL MECHANICAL POLISHING

(75) Inventors: Fu-Liang Yang, Tainan; Chung-Ju Lee, Hsinchu; Meow-Ru Hsu, Yun Lin Hsien; Ming-Hong Kuo, Pintung; Ing-Ruey Liaw, Hsinchu, all of (TW)

(73) Assignee: Vanguard International Semiconductor Corporation, Hsinchu (TW)

( * ) Notice: Under 35 U.S.C. 154(b), the term of this patent shall be extended for 0 days.

(21) Appl. No.: 09/337,936

(22) Filed: Jun. 22, 1999

(51) Int. Cl.[7] .................................................. H01L 21/76
(52) U.S. Cl. ........................... 438/427; 438/424; 438/296
(58) Field of Search ..................................... 438/296, 424, 438/421

(56) References Cited

U.S. PATENT DOCUMENTS

| | | | |
|---|---|---|---|
| 5,728,621 | * | 3/1998 | Zheng et al. ......................... 438/427 |
| 5,872,043 | * | 2/1999 | Chen ..................................... 438/424 |
| 5,923,993 | * | 6/1999 | Sahota ................................... 438/427 |
| 6,048,771 | * | 4/2000 | Lin et al. ............................. 438/296 |
| 6,048,775 | * | 4/2000 | Yao et al. ............................. 438/427 |
| 6,057,207 | * | 5/2000 | Lin et al. ............................. 438/424 |
| 6,057,210 | * | 5/2000 | Yang et al. ........................... 438/427 |
| 6,071,792 | * | 6/2000 | Kim et al. ............................ 438/424 |

* cited by examiner

*Primary Examiner*—Charles Bowers
*Assistant Examiner*—David S Blum
(74) *Attorney, Agent, or Firm*—Harness, Dickey & Pierce, P.L.C.

(57) ABSTRACT

A method for implementing shallow trench isolation by using a non-critical chemical mechanical polishing method in an integrated circuit. After STI regions are etched and insulator oxide layer is deposited and etched back, a planarized insulator oxide layer is formed. The corners of silicon nitride layer over active area are exposed after the etch back step. Then, a silicon nitride cap layer is deposited. A non-critical photoresist patterning is used to expose the bigger active regions. Afterward, the cap layer on the bigger active regions is removed. Thereafter, a non-critical CMP process is used to polish the cap layer on the smaller active regions, then the insulator oxide layer under cap layer is removed by wet etch. Subsequently, a wet etch is used to remove the cap layer and silicon nitride layer. Finally, the shallow trench isolation process is completed after the pad oxide is removed.

20 Claims, 4 Drawing Sheets

SHALLOW TRENCH ISOLATOR VIA NON-CRITICAL CHEMICAL MECHANICAL POLISHING

FIELD OF THE INVENTION

The present invention relates to the fabrication of integrated circuit devices, and more particularly, to a method for forming a shallow trench isolation via a non-critical chemical mechanical polishing (CMP) of ultra-large semiconductor integration (ULSI) processes.

BACKGROUND OF THE INVENTION

Current research is directed towards a greater density of active components per unit area of semiconductor substrate, such that effective isolation between circuits must be installed properly to avoid the short circuiting of adjacent components. There are thermal techniques, such as the local oxidation of silicon (LOCOS), to grow silicon dioxide layers with a thickness more than one thousand angstroms between active devices. The insulating characteristic of silicon dioxide is for isolation purposes and is also called field oxide.

As the size of integrated circuits is reduced, the devices that make up the circuits must be positioned closer together in order to comply with the limited space available on a typical chip. Conventional isolation of circuit components in modern integrated circuit technology takes the form of shallow trenches which are etched into the semiconductor substrate and are filled with an insulating material such as silicon dioxide. These areas are generally referred to as shallow trench isolation (STI). In sub 0.5 microns applications, the use of shallow trench isolation between devices in an integrated circuit wafer is frequently used in place of the LOCOS process. Shallow trench isolation regions serve to isolate the active regions of the integrated circuit and, typically vary widely in dimensions because the active regions of the integrated circuit can be of virtually any size.

In the advanced semiconductor processes, a complex topography of integrated circuits are often encountered. Due to this reason, a problem is always occurs in achieving a uniform shallow trench isolation oxide fill, especially when shallow trenches of widely varying widths are used. In order to solve this problem, a number of methods have been developed for filling shallow trench isolation with insulating materials and for planarizing the topography.

The filling methods of STI include chemical vapor deposition (CVD) and plasma enhanced chemical vapor deposition (PECVD), which take advantage of the fact that material can be evaporated as a vapor and deposited on a surface. PECVD can further improve the stress of the deposited film and reduce the wafer warpage or peeling by the ion bombardment. Planarization methods such as the resist etch back (REB) process, the reactive ion etching (RIE) process, the spin on glass (SOG) method, and the chemical mechanical polishing (CMP) are employed, alone or in combination, to planarize the surface of the semiconductor substrate.

The conventional shallow trench isolation process is strongly dependent on the controllability of chemical mechanical polishing (CMP), which is the only method to provide the global planarization of ultra-large semiconductor integration (ULSI) processes. After the oxide-filled shallow trench isolation is formed, many attempts have been made utilizing CMP processes. One such method is described in U.S. Pat. No. 5,494,857, entitled "CHEMICAL MECHANICAL PLANARIZATION OF SHALLOW TRENCHES IN SEMICONDUCTOR SUBSTRATES" by S. S. Cooperman et al., which applies CMP techniques to etch back the insulating layers and to form shallow trench isolation.

Another method is described in U.S. Pat. No. 5,312,512, entitled "GLOBAL PLANARIZATION USING SOG AND CMP" by Allman, which discusses the global planarization of integrated circuit wafers using Spin On Glass and Chemical Mechanical Polishing processes.

Nevertheless, a plurality of factors includes polishing slurry, pressure on the wafer, polishing pad, particle size distribution of slurry, etc. will affect the CMP planarization profile. A serious drawback for CMP is the difficulty in end point detection. Other weak points are induced from CMP and comprises easy to form microscratches on the polishing surface, bad within wafer uniformity, pattern-dependent polishing uniformity, instability of polishing rate, and contamination control of the wafer.

According to the above descriptions, although CMP can achieve true global planarization on the deposited film, the strong dependence upon CMP of shallow trench isolation may complicate the processes and cause some problems that are not easy to solve.

Summary of the Invention Shallow trench isolation (STI) is now widely used in the ultra-large semiconductor integration (ULSI) industry. Due to the requirement of STI planarization to facilitate the subsequent processes, there are a lot of methods to planarize the STI surface. Chemical mechanical polishing (CMP) procedure dominate the semiconductor planarization processes but will complicate the STI formation and cause some disadvantages such as surface microscratches, polishing uniformity, and unstable polishing rate of the film property. Therefore it is an object of the present invention to provide a method for forming a shallow trench isolation via non-critical chemical mechanical polishing of ULSI processes.

It is another object of the present invention to provide a fully planar surface for an integrated circuit at the conclusion of a shallow trench isolation process.

These objects have been achieved by first forming a pad oxide on a semiconductor substrate, then a silicon nitride formed thereon. Subsequently, the wafer take the first photolithography and etching steps to form a photoresist on the stacked layer and etching the underlying silicon nitride to expose the shallow trench isolation region. After the photoresist is removed, using silicon nitride as a mask to etch the substrate, shallow trench isolation regions are formed therein. After thermal oxidation of the STI regions, depositing a thick layer of dielectric layer to fill the STI regions by using a high density plasma chemical vapor deposition (HDP-CVD) method. The dielectric layer is silicon dioxide ($SiO_2$) and the HDP oxide is a more stable film than ozone-TEOS, which can fill a narrow trench without any weak spot. Thus, thickness of deposited oxide in shallow trenches is un-conformal and almost independent of trench widths.

After the step of trench filling, a wet etching step is used to etch back the oxide layer. Since the oxide layer is deposited both on the shallow trenches and the silicon nitride layer, the oxide layer formed on the silicon nitride will be etched simultaneously to expose the corner of the silicon nitride. Then a second silicon nitride layer is deposited on STI regions and the first silicon nitride regions (active regions) to act as a cap layer. Afterward, a non-critical photolithography and etching step is used to form a patterned photoresist and expose bigger active areas with a width more than 1 micron meter. Then, the top silicon nitride layers on bigger active areas are removed.

After stripping of the remaining photoresist, a non-critical chemical mechanical polishing step is used to polish the result structure. The purpose of the non-critical CMP process is not for the planarization of the STI regions, but is used to remove the cap layer on smaller active areas. Then, the oxide layer overlaying active areas are wet etched by using dilute HF solution wet dip or BOE. The wet acid solutions have a very slow etching rate on silicon nitride, therefore the active areas under nitride layer and the oxide layer within STI regions will not be affected. After the wet etching step of oxide layer, another wet etching step using hot $H_3PO_4$ solution is also employed to strip the remaining first and second silicon nitride layers.

As described in the previous descriptions, a conventional CMP process is also used. Nevertheless, a non-critical photoresist patterning process in combination with a non-critical CMP process are used to ease the production, the drawbacks of critical CMP process controllability for STI planarization to not exist. Thus the integrated shallow trench isolation process is much easier for mass production.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Local oxidation of silicon (LOCOS) isolation processes have long been used to provide device isolation in integrated circuit elements. When used in sub-micron processes, however, limitations of LOCOS such as the lateral effects of bird's peak, non-planarity, thinning, and stress-induced silicon defects cause severe problems. Shallow trench isolation (STI), wherein trenches are formed in the integrated circuit wafer and filled with an insulator has been used to provide device isolation for devices in the sub-micron range. Since the material filling the trenches is applied in a blanket type, the deposition film must be planarized after the trenches have been filled.

Before proceeding with the description of the present invention, it is noted that the depicted drawings of the present invention with the same labels are denoted as the same material. It is also noted that the thickness of every layer is not depicted according to the true amplification ratio. Besides, since there are a lot of lithographic and etching steps that are well-known in the art, it is not described in detail in the following description.

Figure 1:
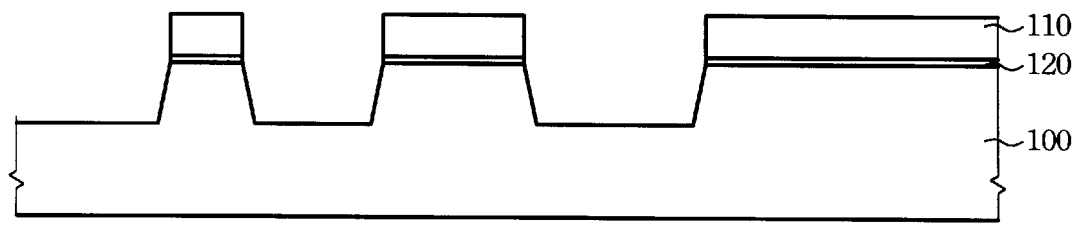
FIG. 1 shows a cross section of an integrated circuit wafer with shallow isolation trenches formed therein according to the present invention.

Referring to FIG. 1, the figure shows STI regions formed in a semiconductor substrate 100. Before etching of the STI region, a pad silicon oxide 120 is grown on the surface of the semiconductor substrate 100 using an oxidation furnace. In one embodiment, the pad oxide layer is silicon dioxide ($SiO_2$) and the thickness of pad oxide 120 is between about 50 and 300 angstroms. A silicon nitride ($Si_3N_4$) layer 110 is deposited over the pad oxide layer 120 by a suitable chemical vapor deposition (CVD) method such as plasma enhanced chemical vapor deposition (PECVD). In one embodiment, the thickness of silicon nitride layer 110 is between about 1000 and 2000 angstroms.

After pad oxide layer 120 and silicon nitride layer 110 are formed on the substrate 100, photolithography and etching steps are applied to form a patterned photoresist over the stacked layer (not shown in the figure). Thereafter, the patterned photoresist is used as a mask to etch the underlying silicon nitride layer 110. Subsequently, the etched silicon nitride layer 110 is used as a mask to form shallow trench isolation regions. In one embodiment, the trenches have a depth of between about 0.4 microns and 0.6 microns. The active areas between STI regions can have different widths according to different integrated circuit designs.

Figure 2:
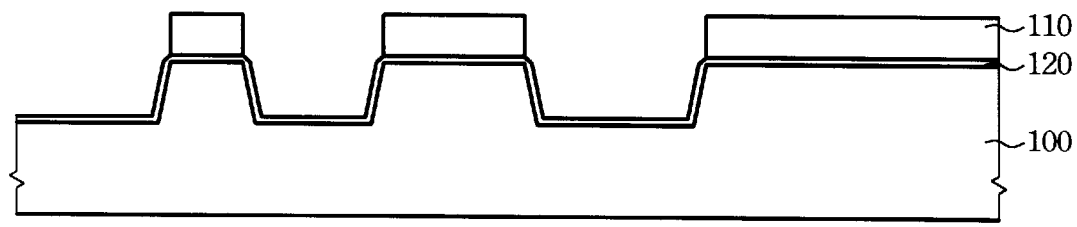
FIG. 2 shows a cross section of an integrated circuit wafer with linear oxidation of shallow isolation trenches according to the present invention.

Referring to FIG. 2, a linear oxidation is used to form an oxide film, which covers the sidewalls and bottoms of the trenches.

Figure 3:
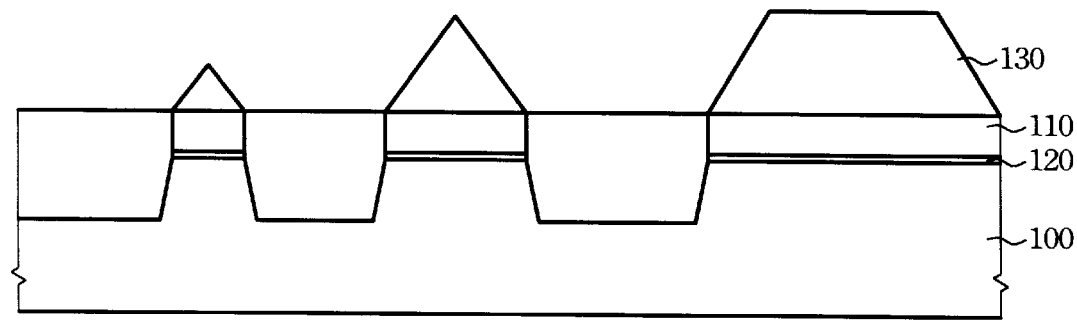
FIG. 3 shows a cross section of an integrated circuit wafer with HDP-CVD oxide deposition according to the present invention.

Referring to FIG. 3, a layer of silicon dioxide ($SiO_2$) 130 is then formed over the STI regions and active areas. The silicon dioxide layer 130 is deposited by using a high density plasma chemical vapor deposition (HDPCVD) method and such HDP oxide can use $SiH_4$, $O_2$, and Ar chemistry and an inductively coupled plasma source to generate a high density plasma.

Besides, the deposited HDP oxide film 130 is very un-conformal and the side wall deposition is much slower than plane deposition. For the trenches with different widths, HDP oxide is more stable and will fill a narrow trench with the thickness independent of trench width.

Figure 4:
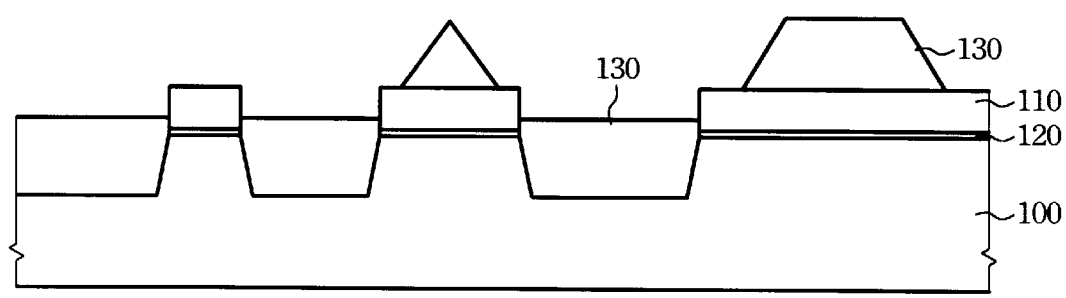
FIG. 4 shows a cross section of an integrated circuit wafer with HDP oxide etch back according to the present invention.

Referring now to FIG. 4, after the step of trench filling, a wet etching is used to etch back the silicon dioxide film 130. Recently, there has been a resurgence of wet etching for certain process steps because plasma etching fails to provide the required etch selectivity, damage-free interface, and particle-contamination-free wafers. Wet etches are especially suitable for blanket etches of polysilicon, oxide, nitride, and metal. The silicon dioxide film 130 can use dilute hydrofluoric acid (HF) solution or BOE solution to etch. The etch rate of oxide etching depends on etchant concentration, agitation, and temperature. In addition, density, porosity, microstructure, and the purity of the silicon dioxide film also affect the etch rate. Besides, nitride film etches are much slower than silicon dioxide in dilute HF solution. That is, after etch back of the silicon dioxide film 130, the silicon nitride layer 110 over active area will not be affected.

As can be seen in FIG. 4, the filling oxide 130 in trenches is wet etched to a certain level and the oxide layer 130 on active regions will expose underlying silicon nitride layer 110. The exposed step of the present invention is very important, because the exposed corner of silicon nitride layer 110 will combine the subsequent cap layer to protect the underlying trench filling oxide.

Figure 5:
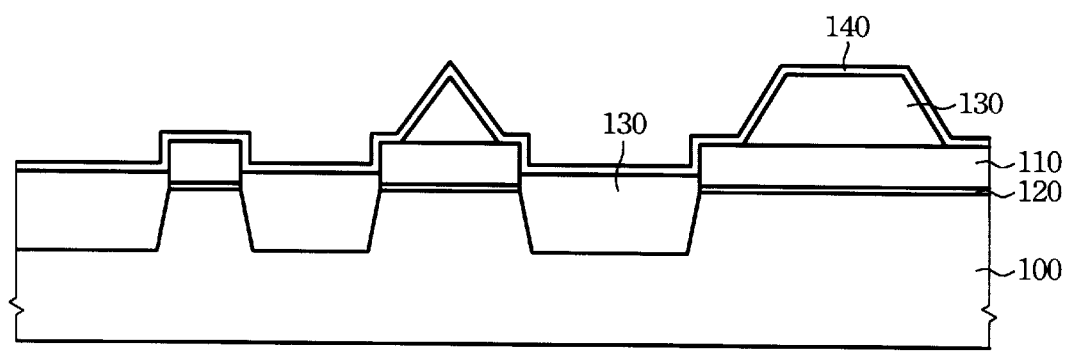
FIG. 5 shows a cross section of an integrated circuit wafer with deposition of a silicon nitride layer according to the present invention.

Referring to FIG. 5, after etch back of the oxide layer 130, a silicon nitride layer 140 is blanket deposited over the HDP oxide material and silicon nitride layer 110 by a suitable chemical vapor deposition method such as plasma enhanced chemical vapor deposition. The thickness of the silicon nitride layer 140 is between about 200 and 2000 angstroms. The silicon nitride layer 140 is commonly used in passivation layers on integrated devices because of its ability to protect against the diffusion of impurities and water. This silicon nitride layer 140 is also called a cap layer.

Figure 6:
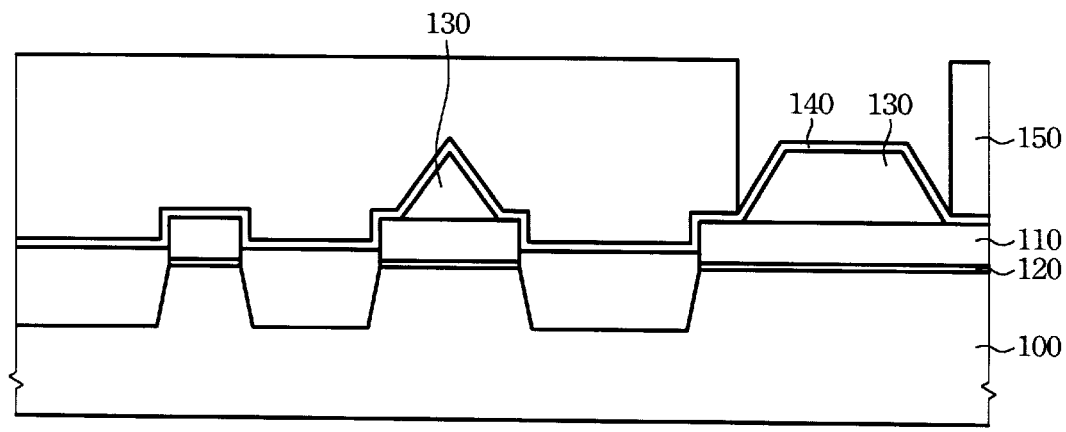
FIG. 6 shows a cross section of an integrated circuit wafer with non-critical photoresist patterning according to the present invention.

Referring to FIG. 6, the figure shows a cross section of an integrated circuit wafer with non-critical photoresist patterning according to the present invention. After the cap layer 140 is formed, a second photolithography and etching step is used to form a patterned photoresist 150 on the cap layer 140. According to the different design rule the integrated circuit, there are diverse widths of active areas. In order to ease the fabrication processes, the exposed areas of patterned photoresist 150 are based on the bigger active areas with the width more than 1 micron. Another reason for the non-critical photoresist patterning is to increase the reliability of the later processes.

Figure 7:
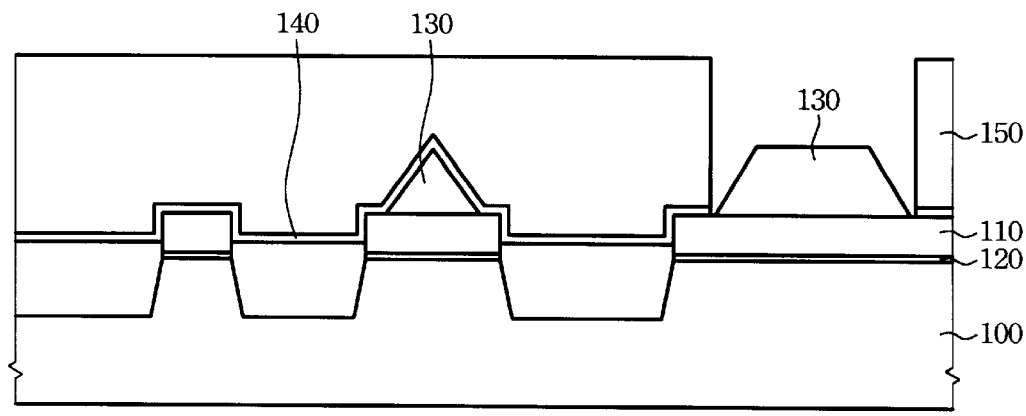
FIG. 7 shows a cross section of an integrated circuit wafer with silicon nitride layer stripped away according to the present invention.

Now referring to FIG. 7, this figure shows a cross section of an integrated circuit wafer with silicon nitride layer stripped away according to the present invention. Since the patterned photoresist 150 exposed cap layer 140, wet etch steps are used to strip the cap layer 140. Silicon nitride film is etchable at room temperature in concentrated HF solution or in $H_3PO_4$ at a temperature between about 150 to 200° C. The etch rate is strongly affected by the oxygen concentration in the nitride film. In this figure, the cap layer 140 is removed by using underlying oxide layer 130 as an etch stop.

Figure 8:
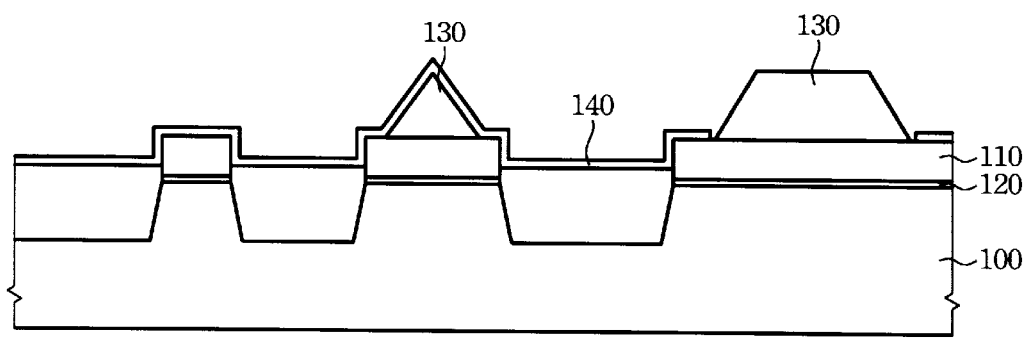
FIG. 8 shows a cross section of an integrated circuit wafer with photoresist stripped away according to the present invention.

Referring to FIG. 8, the patterned photoresist layer 150 is stripped away in this figure. As can be seen in this figure, after the patterned photoresist layer 150 is removed, the corner area of silicon nitride film 110 is combined with cap layer 140 to protect the trench filling oxide.

Figure 9:
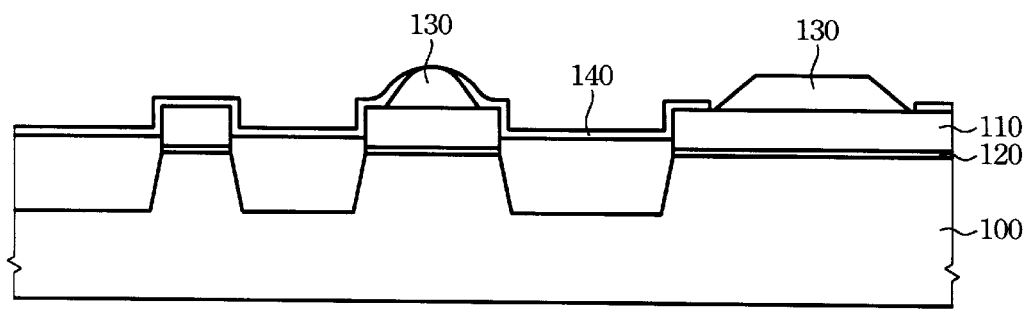
FIG. 9 shows a cross section of an integrated circuit wafer with non-critical chemical mechanical polishing according to the present invention.

Now referring to FIG. 9, a cross section of the figure shows a non-critical chemical mechanical polishing method is used to polish the resulting structure. Unlike the conventional CMP process, the main purpose of the non-critical CMP is to remove the cap layer 140 over smaller active areas. As can be seen in the figure, the non-critical CMP is easier to perform and will not affect the trench filling oxide. The remaining silicon dioxide film 130 on smaller active areas will be exposed.

Figure 10:
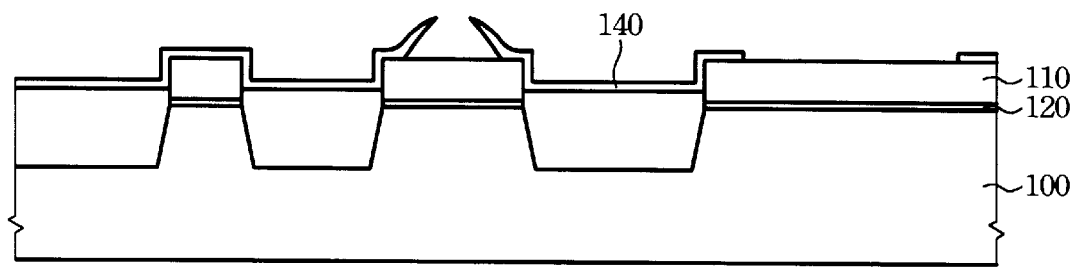
FIG. 10 shows a cross section of an integrated circuit wafer with oxide layer wet etched away according to the present invention.

Referring to FIG. 10, since the cap layer 140 over the bigger areas and smaller areas is removed, dilute hydrofluoric acid solution or BOE solution is used as described earlier to etch the oxide layer 130 as shown in the figure. Since the oxide-to-nitride selective wet etch with dilute HF solution is possible, the nitride film is almost unaffected.

Figure 11:
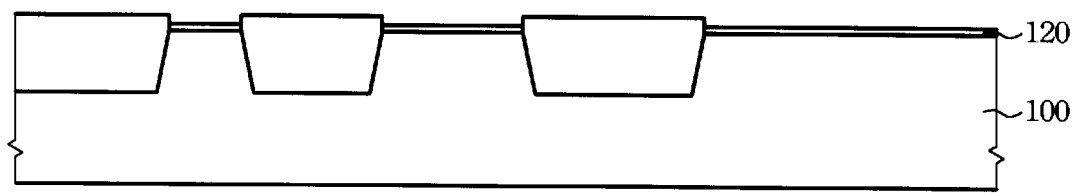
FIG. 11 shows a cross section of an integrated circuit wafer with silicon nitride layer wet etched away according to the present invention.

Referring to FIG. 11, the figure shows a cross section of an integrated circuit wafer with silicon nitride layer wet-etched away. After oxide layers on the bigger and smaller active areas are removed, there are silicon nitride layer 110 and silicon nitride cap layer 140 left in the structure. Then hot $H_3PO_4$ solution is used as described above to strip the nitride layer.

Figure 12:
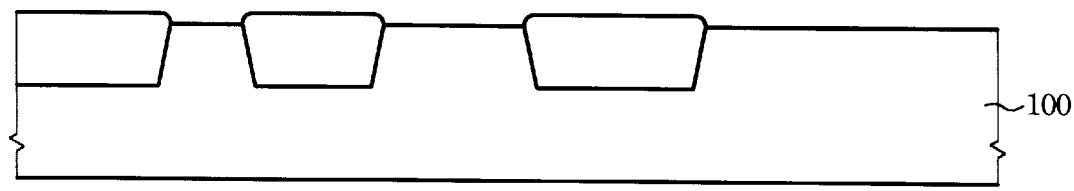
FIG. 12 shows a cross section of an integrated circuit wafer with pad oxide removed according to the present invention.

Referring to FIG. 12, the figure shows a cross section of an integrated circuit wafer with the pad oxide being removed. After the pad oxide layer 120 is stripped away, the shallow trench isolation regions with non-critical CMP process are complete.

The process of the present invention results in the formation of planarized shallow trench isolation using HDP oxide. HDP oxide is a high quality oxide having a low wet chemical etching rate, and fewer problems in subsequent processing steps. The self-planarized process with non-critical chemical mechanical polishing process will avoid the STI regions generate microscratches surface due to polishing, pattern-dependent polishing surface, uniformity of the surface, instability of polishing rate. It is apparent that due to the processes of the present invention, the integrated shallow trench isolation process is much easier for mass production.

As is understood by a person skilled in the art, the foregoing preferred embodiments of the present invention are illustrative of the present invention rather than limiting of the present invention. They are intended to cover various modifications and similar arrangements included within the spirit and scope of the appended claims, the scope of which should be accorded the broadest interpretation so as to encompass all such modifications and similar structures.

What is claimed is:

1. A method for implementing shallow trench isolation in an integrated circuit, said method comprising the steps of:
    forming a first dielectric layer on a semiconductor wafer;
    forming a second dielectric layer on said first dielectric layer;
    defining active and non-active regions on said second dielectric layer, wherein said active regions comprise narrow and wide active regions;
    forming isolation trenches in said non-active regions using said second dielectric layer as a mask;
    depositing a third dielectric layer by a high density method over said isolation trenches and said second dielectric layer;
    etching said third dielectric layer of said isolation trenches and said active regions to expose corners of said second dielectric layer;
    forming a fourth dielectric layer on said third dielectric layer and said second dielectric layer;
    etching said fourth dielectric layer on said wide active regions using a patterned photoresist as a mask;
    polishing said fourth dielectric layer on said narrow active regions to expose said third dielectric layer;
    etching said third dielectric layer which is formed on said active regions;
    etching said fourth dielectric layer and said second dielectric layer; and
    etching said first dielectric layer.

2. The method according to claim 1, wherein said first dielectric layer is silicon dioxide ($SiO_2$) layer.

3. The method according to claim 1, wherein said second dielectric layer is silicon nitride ($Si_3N_4$) layer.

4. The method according to claim 1, wherein said third dielectric layer is silicon dioxide layer.

5. The method according to claim 1, wherein said fourth dielectric layer is silicon nitride layer.

6. The method according to claim 1, wherein said depositing said third dielectric layer step use a high density plasma method is a chemical vapor deposition (HDP-CVD) method.

7. The method according to claim 1, wherein said wide active regions have a width more than 1 microns.

8. The method according to claim 1, wherein said etching said third dielectric layer on said active regions step use dilute HF solution.

9. The method according to claim 1, wherein said etching said fourth dielectric layer and said second dielectric layer step use $H_3PO_4$ solution.

10. The method according to claim 9, wherein said etching is performed at a temperature between about 150° C. and 200° C.

11. The method according to claim 1, wherein said isolation trenches are etched with a depth between about 0.4 microns and 0.6 microns.

12. The method according to claim 1, wherein said polishing step use a chemical mechanical polishing (CMP) method.

13. A method for implementing shallow trench isolation in an integrated circuit, said method comprising the steps of:

forming a pad oxide layer on a semiconductor wafer;

forming a silicon nitride layer on said pad oxide layer;

defining active and non-active regions on said silicon nitride layer, wherein said active regions comprise narrow and wide active regions;

forming isolation trenches in said non-active regions using said silicon nitride layer as a mask;

depositing a insulator oxide layer by a high density method over said isolation trenches and said silicon nitride layer;

etching said insulator oxide layer of said isolation trenches and said active regions to expose corners of said silicon nitride layer;

forming a cap layer on said insulator oxide layer and said silicon nitride layer;

etching said cap layer on said wide active regions using a patterned photoresist as a mask;

polishing said cap layer on said narrow active regions to expose said insulator oxide layer;

etching said insulator oxide layer which is formed on said active regions;

etching said cap layer and said silicon nitride layer; and etching said pad oxide layer to complete said isolation trenches.

14. The method according to claim 13, wherein said pad oxide layer is silicon dioxide ($SiO_2$) layer.

15. The method according to claim 13, wherein said cap layer is silicon nitride ($Si_3N_4$) layer.

16. The method according to claim 13, wherein said depositing said insulator oxide layer step use a high density plasma method is a chemical vapor deposition (HDP-CVD) method.

17. The method according to claim 13, wherein said wide active regions have a width more than 1 microns.

18. The method according to claim 13, wherein said etching said insulator oxide dielectric layer on said active regions step use dilute HF solution.

19. The method according to claim 13, wherein said etching said cap layer and said silicon nitride layer step use $H_3PO_4$ solution.

20. The method according to claim 19, wherein said etching is performed at a temperature between about 150° C. and 200° C.

* * * * *